Sept. 19, 1961 R. W. FRITTS ET AL 3,001,126

THERMOELECTRIC CONTROL CIRCUIT

Filed Aug. 12, 1957

INVENTORS
Robert W. Fritts &
Sebastian Karrer
BY Seegert & Schwallbach
Att'ys

21

United States Patent Office 3,001,126

Patented Sept. 19, 1961

3,001,126

THERMOELECTRIC CONTROL CIRCUIT

Robert W. Fritts, Elm Grove, Wis., and Sebastian Karrer, Port Republic, Md., assignors, by mesne assignments, to Minnesota Mining and Manufacturing Company, St. Paul, Minn., a corporation of Delaware Filed Aug. 12, 1957, Ser. No. 677,625
4 Claims. (Cl. 323—69)

Figure 1:
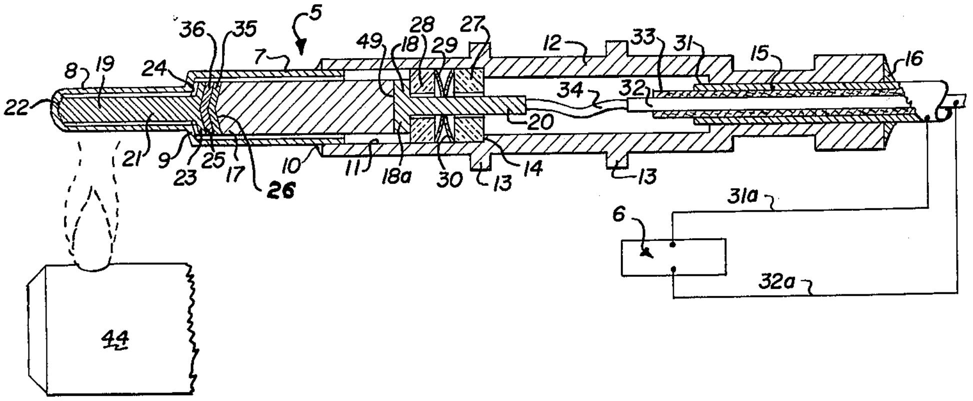

This invention relates to improvements in thermoelectric control circuits, and more particularly to a temperature responsive thermoelectric control circuit having a non-linear current-temperature characteristic.

Thermoelectric generators of the type heretofore available have been widely used both in temperature measurment and in control circuits, but because of the fact that circuits utilizing such generators have a generally linear circuit current-hot junction temperature characteristic of moderate slope, thermoelectric generators have not been generally adaptable for use in affording controlling changes in current to, for example, cycling electromagnetic valves or relays in response to relatively small changes in temperature at the generator hot junction, because such use requires expensive additional equipment, for example, electronic signal amplifying and converting equipment.

Recent developments in the field of solid state physics have provided new semi-metallic and semiconductor materials having unique electrical properties. For example certain new semi-metallic materials find particular utility as thermoelectric generator elements, affording generators a current-hot junction temperature characteristic of substantial increased slope, as well as affording substantially increased power output. Certain new semiconductor materials, on the other hand, are particularly useful as thermistor materials by virtue of a negative temperature coefficient of resistivity greater than that of any previously known materials.

With the foregoing in mind, it is a general object of the present invention to provide, by the use of the aforementioned new materials, an inexpensive and reliable control circuit of novel construction which is well adapted to afford controlling changes in current flow to, for example, electromagnetic valves or relays in response to relatively small changes in temperature of a given medium, said circuit having a non-linear temperature-current characteristic attaining a steep slope at operating temperatures.

Another object of the invention is to provide a control circuit of the aforementioned character wherein the desirable temperature-current characteristic is afforded by combining electric energy source means having an improved positive temperature coefficient of current generation with control means having a high positive temperature coefficient of conductance in a manner to render both said source means and said control means responsive to the temperature of the same medium.

A more specific object of the invention is to provide an improved thermoelectric control circuit including a thermoelectric generator having relatively high power output and a hot junction temperature-current characteristic of relatively steep slope and a thermistor having a high negative coefficient of resistivity, said thermistor being disposed adjacent the hot junction portion of said generator for exposure to the temperature thereat.

Still another specific object of the invention is to provide an improved thermoelectric generator assembly having thermoelements joined by thermojunction means including a thermistor.

Another object of the invention is to provide an improved thermoelectric generator assembly the current output of which, though substantially affected by slight temperature fluctuations at the hot junction thereof, is not substantially affected by slight temperature fluctuations at the cold junctions thereof. Thus, the influence of ambient temperature fluctuations on the current output of the improved assembly is substantially insignificant.

Figure 2:
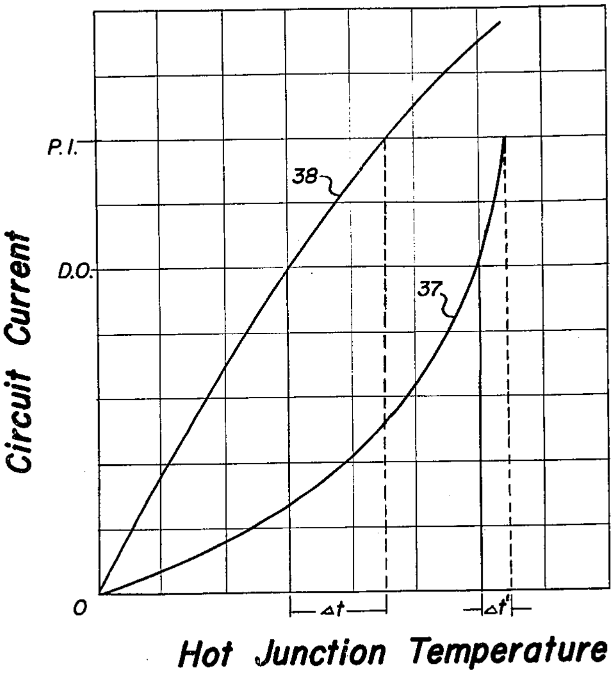

Other objects and advantages of the invention will become apparent as the description proceeds, reference being had to the accompanying drawing wherein:

FIGURE 1 is a view illustrating one form of the improved control circuit, the thermoelectric generator assembly of which is shown in axial section, the remainder diagrammatically; and FIGURE 2 is a graph, one curve of which illustrates the current-hot junction temperature characteristic of a thermoelectric circuit, and the other curve of which illustrates the same characteristic of the same circuit having a thermistor connected in series therein and subject to the hot junction temperature in accordance with the principles of the present invention.

Referring more particularly to FIGURE 1 of the drawing, the improved control circuit comprises essentially a thermoelectric generator assembly 5 of novel construction having means for connection to a load which may take the form of a control device, for example, an electromagnetic valve or the relay shown diagrammatically at 6, to which the generator assembly 5 supplies controlling values of energizing current in response to relatively small variations in the temperature at the hot junction of said generator.

More specifically, the illustrated generator assembly 5 takes the form of a thermocouple comprising a first thermoelement 7 in a form of a tubular sheath member having a reduced diameter outer end portion 8 providing an internal annular shoulder 9. The sheath member 7 is fixed, as by silver soldering or brazing at 10, within a counterbore 11 formed in an end portion of a mounting or an extension sleeve 12, the latter being formed with suitable external shoulder means 13 for coaction with mounting means (not shown) for the assembly 5. The counterbore 11 provides an annular internal shoulder 14, and the opposite end of the sleeve 12 is formed with a portion of reduced internal diameter 15 snugly to receive one end of a coaxial lead comprising a tubular outer conductor 31 and inner conductor 32 separated by a tubular insulating sleeve 33. The tubular outer conductor 31 is electrically connected and sealed to the sleeve 12, as by silver soldering or brazing at 16.

Coaxially disposed within the enclosure afforded by the sheath member 7 and sleeve 12 is a second thermoelement 17 in the form of a cylindrical ingot which, with the first thermoelement 7 comprises a thermocouple. The aforementioned thermocouple has an outer cold thermojunction at the juncture of thermoelement 7 with sleeve 12, and has an inner cold thermojunction at the juncture 49 of thermoelement 17 with a contact electrode 18, the latter preferably having a stem portion 20 and a cylindrical head portion **18*a* fused or bonded at 49 to the thermoelement 17**.

The generator assembly 5 is also provided with hot thermojunction means comprising contact electrodes 19 and 35 and a thermistor 36 having a high negative temperature coefficient of resistivity. The contact electrode 19 has an elongated stem portion 21 extending coaxially in spaced relation with respect to the reduced diameter portion 8 of the sheath 7, and is joined at its outer end to the outer end of said reduced diameter sheath portion, as by welding at 22. The contact electrode 19 also has an enlarged head portion 23 seated against the annular shoulder 9 of the sheath member 7. The head portion 23 is preferably formed with means, for example radial grooves 24 in the surface thereof abutting shoulder 9, affording communication between the interior of the larger diameter portion of the sheath member 7 and the interior of the reduced diameter sheath portion 8. The head portion 23 of electrode 19 is also preferably formed with a concave conical surface 25 for receiving the adjacent complementary convex conical outer end surface of the thermistor 36. The thermistor 36 preferably has a concave conical inner end surface for receiving the adjacent complementary convex conical outer end surface of the contact electrode 35, and the contact electrode 35 preferably has a concave conical inner end surface, for receiving the adjacent complementary convex conical outer end surface 26 of the thermoelement 17. As shown, the head 23 of contact electrode 19, the contact electrode 35 and the thermistor 36 may be of the same diameter as the thermoelement 17 and, in any event the thermistor 36 and contact electrode 35 are spaced from the sheath 7.

Disposed between the head portion 18a of the contact electrode 18 and the internal annular shoulder 14 of the sleeve 12 are a pair of insulating bushings 27 and 28, and a pair of compression springs 29 and 30 in the form of centrally apertured concavo-convex spring washers. The contact electrode stem 20 extends through the bushings 27 and 28 and washers 29 and 30 as shown, and the compression springs 29 and 30 bias the bushing 27 against the shoulder 14 and the bushing 28 against the head 18a of contact electrode 18, thereby placing the thermoelement 17, contact electrode 35 and thermistor 36 under axial compression between electrodes 18 and 19. The bushings 27 and 28 maintain the electrode stem 20, and thereby the adjacent end of the thermoelement 17 centered within the sleeve 12, and the coaction of the conical end surfaces on the thermoelement 17, electrode 35, thermistor 36 and electrode 19 maintain the outer end of the thermoelement, contact electrode 35 and thermistor 36 centered within the sheath member 7 under the aforementioned compression.

The sheath member 7 is preferably made of an alloy of steel containing a metal that on oxidation forms a "refractory" oxide, i.e., an oxide that is very stable at high temperatures and is not reducible by hydrogen. Examples of such material are chromium, beryllium, zirconium, and titanium. On the other hand, the contact electrodes 18, 19 and 35 are preferably formed of a material which will not react with the thermoelement 17 or thermistor 36, and which if oxidized, forms an oxide which is more readily reducible at normal operating temperatures than is the aforementioned refractory oxide. Suitable materials from which the contact electrodes 18, 19 and 35 may be made are iron, molybdenum and alloys of iron and molybdenum, each of said materials preferably having only the normal minute amounts of residual impurity therein.

The thermoelement 17 is preferably a semi-metallic element and may be formed, for example, of an alloy further described in the copending application of Sebastian Karrer, Serial No. 475,540, filed December 15, 1954, and assigned to the assignee of the present application, said alloy comprising lead and at least one member of the group tellurium and selenium. For example, the thermoelement 17 of lead-selenium-tellurium composition could include a selenium-tellurium constituent in which the selenium is but a trace. In this case such constituent should constitute 35% to 38.05% by weight of the composition, the balance (61.95% to 65% by weight) being lead. At the other extreme, where the selenium-tellurium constituent consists almost entirely of selenium with but a trace of tellurium, such constituent should comprise 25% to 27.55% by weight of the final composition, the remainder (from 72.45% to 75% by weight) being lead. Between these two extremes, the selenium-tellurium constituent varies linearly with the ratio of selenium to tellurium (expressed in atomic percent) in the selenium-tellurium constituent.

With regard to the aforementioned compositions it will be observed that in each case there is an excess of lead over and above the amount thereof necessary for satisfying the stoichiometric proportions of the compound formed in the second constituent or constituents, i.e., the tellurium or selenium. For example, the composition consisting substantially of lead and selenium can contain up to 10.4% lead by weight of the total composition over and above the 72.41% by weight lead stoichiometrically necessary for combination with selenium.

The electrical characteristics of the aforementioned semi-metallic alloys, desirable, for example in thermoelectric generator elements, can be markedly and advantageously altered in a reproducible manner by the addition thereto of controlled amounts of matter other than the constituents of the base composition. Such additions may also be denominated "beneficial impurities," as distinguished from undesirable impurities. For convenience, these additions are hereinafter designated "promoters," since they tend to enhance the electrical characteristic desired for the particular application of the base compositions.

The above described base compositions exhibit negative thermoelectric power and negative conductivity. By the addition of certain "promoters," such negative properties may be enhanced, while the polarity of the electrical properties of the base composition may be reversed by the addition of certain other promoters to provide a semimetallic composition having positive electrical characteristics. Suitable negative promoters are bismuth, tantalum, zirconium, titanium, gallium, bromine and iodine; while suitable positive promoters are sodium and potassium. The copending application of Robert W. Fritts and Sebastian Karrer, Serial No. 475,488, filed on December 15, 1954, and assigned to the assignee of the present application, gives a complete description of the beneficial impurities, including both departures from perfect stoichiometry and promoters, which have been found to be effective for improvement of electrical properties of the semi-metallic thermoelectric generator elements when added to the aforementioned base compositions in minor amounts. For example, up to a maximum of 6.9% by weight of beneficial impurity, including 3.9% excess lead and 3.0% promoter.

The proportions and ranges of the various constituents aforementioned, and particularly the minimum limits of lead constituent in the compositions, must be regarded as critical if the composition is to have the electrical and physical properties desired. If the lead content is significantly less than the minimum amount indicated for any particular selenium-tellurium proportion, the polarity of the Seebeck E.M.F. changes, and the desired electrical and mechanical properties will not be reproducible. On the other hand, if the lead content of any composition appreciably exceeds the aforementioned maximum limits, the resulting composition is too metallic in nature to afford satisfactory energy conversion efficiencies.

Not only are the proportions and ranges of the aforedescribed compositions to be considered critical, but so also is the purity. More specifically, the limit of tolerable metallic impurity in non-promoted final compositions has been found to be of the order of 0.01%, and the composition must be substantially oxygen-free, if the mechanical and electrical properties desired are to be obtained and are to be reproducible. In the case of promoted compositions, however, the limit of tolerable impurities is 0.001%.

The thermistor 36 may be of material of the type disclosed in the copending application of Russell E. Fredrick, Robert W. Fritts and Clarence R. Manser, Case 1, Serial No. 629,326, filed December 19, 1956, and assigned to assignee of the present application. The material disclosed in the aforementioned application takes the form of a non-stoichiometric binary intrinsic semiconductor crystal of indium and tellurium consisting essentially of from 37.60% to 38.50% by weight of indium, the balance being substantially all tellurium, and containing less than 0.1% residual impurity. This crystal may be produced by melting the indium and tellurium constituents in the proportions stated under an atmosphere of hydrogen, casting the reaction product into ingots, and then annealing the ingots under hydrogen at about 550° C. for about fifteen hours. The end surfaces are then suitably machined, and the side wall surface portions not directly contacted in the assembly 5 are preferably coated with a resin or varnish having high electrical resistivity, in order to prevent formation of an oxide surface layer of lower resistance tending to short circuit the thermistor.

The improved control circuit includes an electrical connection between the inner lead conductor 32 and the stem 20 of contact electrode 18 in the form of a flexible conductor 34, and said circuit also includes suitable means indicated diagrammatically by conductors 31a and 32a, for effecting an electrical connection between lead conductors 31 and 32 respectively with electromagnet winding 6a of the relay 6. The relay 6 also has an armature 6b movable to attracted and retracted positions and contacts 6c movable to closed and open positions respectively with movement of the armature to attracted and retracted positions. The contacts 6c may be connected into a secondary circuit, as by conductors 50 and 51, for controlling the flow of electrical current from a suitable source 52 through a load 53 interposed in the conductor 51 as shown.

In the illustrated generator 5, the reduced diameter sheath portion 8 and the contact electrode stem 21 comprise heat probe means adapted to receive heat from a medium to the temperature of which the improved circuit is to be responsive, for example, from burning fuel at a pilot burner shown fragmentarily at 44 and juxtaposed with respect to the generator assembly 5. Heating of the thermocouple adjacent to the outer end of the reduced diameter portion 8 thereof as shown affords a temperature gradient within the sheath 7 and sleeve 12 providing a relatively high temperature at the outer end of the reduced diameter portion 8 of the sheath member 7, with gradually decreasing temperatures at points inwardly therefrom. Thus, the temperature at the thermistor 36 and the outer end surface 26 of thermoelement 17 is substantially lower than the temperature at the outer end of portion 8, but is, however, sufficiently high for proper current generation.

The magnitude of the current generated by the generator assembly 5 is dependent primarily upon the temperature differential across the thermoelement 17, i.e., the temperature differential between the hot junction means and the inner cold junction means, and to a lesser extent, to the temperature differential between the hot junction means and the outer cold junction.

Referring now to FIGURE 2 of the drawing, the curve 37 illustrates the circuit current-hot junction temperature characteristic of the improved control circuit shown in FIGURE 1, and the curve 38 illustrates the circuit current-hot junction temperature characteristic of the same circuit with the thermistor 36 omitted. It will be observed that the curve 38 approaches linearity and is typical of thermoelectric generators utilizing semi-metallic thermoelements of high thermoelectric power, said curve illustrating that the circuit current varies with variations in hot junction temperatures, in a circuit of substantially fixed resistance.

Curve 37 of FIGURE 2 illustrates the effect on the circuit current of the same circuit when a thermistor, for example, the thermistor 36, is connected in series in said circuit and is subjected to substantially the same temperature as the hot junction of the thermoelectric generator. The thermistor 36, having a high negative temperature coefficient of resistivity, interposes a substantial resistance into the circuit at lower hot junction temperatures, said resistance dropping off exponentially with a corresponding exponential increase in conductance as the hot junction temperature increases. The net result is that the circuit current-hot junction temperature characteristic assumes the parabolic form of curve 37 which at the higher temperatures assumes a very steep slope. This steep slope can be utilized advantageously in the control of control devices by virtue of the fact that at relatively high temperatures a relatively small differential in hot junction temperatures effects a substantial differential in circuit current.

With further reference to FIGURE 2, let it be assumed that the control circuit of which the curves 37 and 38 are characteristic includes a control device 6, for example, an electromagnetic valve or relay, having a pull-in current value P.I. and a drop-out current value D.O. It will be noted that in the circuit of which the curve 38 is characteristic, the hot junction temperature differential $\Delta t$ necessary to drop the circuit current from the level P.I. to the level D.O. is approximately three times the differential $\Delta t'$ required by the circuit of which the curve 37 is characteristic. This makes the improved control circuit highly responsive to relatively small changes in hot junction temperature and makes practical the control of electroresponsive control devices having substantially disparate pull-in and drop-out values, responsive to such relatively small variations.

From the foregoing, it is apparent that the improved control circuit comprises condition responsive electric energy source means in the form of the thermocouple comprising thermoelements 7 and 17, the output of said couple varying with variations in a condition of a given medium, more specifically, the temperature of the medium at the hot thermojunction as affected by the flame of the burner 44. It will also be observed that the thermistor 36 affords condition responsive control means in circuit with the source means and also responsive to variations in the condition of the same medium, said control means exhibiting a high rate of conductance change per unit change in said condition, the response of said control means to variations in said condition being such as to provide increasing conductance simultaneously with increasing output of the source means and decreasing conductance simultaneously with decreasing output of the source means, such that a high rate of change of current flow through the circuit is afforded per unit change in the condition, i.e., the temperature, of the medium.

While in the illustrated form of the invention, the thermistor 36 is incorporated as part of the unitary thermoelectric generator assembly 5, it is within the concept of the invention to have the thermistor separate from the thermoelectric generator portion of the control circuit, but nevertheless in series with the generator and subject of the temperature of the same medium as the hot junction of the generator.

Having thus described a control circuit structure and organization as one specific embodiment of the present invention, it is to be understood that the illustrated form was selected to facilitate the disclosure of the invention rather than to limit the number of forms which it may assume. Various modifications, adaptations and alterations may be applied to the specific form shown to meet the requirements of practice without in any manner departing from the spirit or scope of the present invention, and all of such modifications, adaptations and alterations are contemplated as may come within the scope of the appended claims.

What is claimed as the invention is:

1. A thermoelectric generator assembly adapted for connection to a circuit to be energized and having a high temperature coefficient of current output, comprising a first elongated thermoelement, means including a second thermoelement affording a sheath-like enclosure for said first thermoelement and having an end portion, and means within said end portion of said enclosure affording a hot thermojunction joining said thermoelements, said last-mentioned means including a thermistor having a high negative temperature coefficient of resistivity in series circuit with said thermoelements.

2. A thermoelectric generator in accordance with claim 1 in which the first thermoelement is made of a semimetal and the second thermoelement is made of steel.

3. A thermoelectric generator according to claim 1 in which the thermistor is a semiconductor consisting essentially of indium and tellurium.

4. A thermoelectric generator assembly according to claim 1 in which the first thermoelement is made of a semi-metallic alloy of lead and at least one member of the group tellurium and selenium, the second thermoelement is made of steel, and the thermistor is a semiconductor consisting essentially of indium and tellurium.

References Cited in the file of this patent

UNITED STATES PATENTS

| | | |
|---|---|---|
| 2,526,251 | Medlar | Oct. 17, 1950 |
| 2,626,970 | Hunrath | June 27, 1953 |
| 2,691,056 | Wolff | Oct. 5, 1954 |

FOREIGN PATENTS

| | | |
|---|---|---|
| 142,775 | Switzerland | Dec. 16, 1930 |